(12) United States Patent
Motomatsu

(10) Patent No.: US 6,803,873 B1
(45) Date of Patent: Oct. 12, 2004

(54) PIPELINE ANALOG TO DIGITAL CONVERTER

(75) Inventor: Ryo Motomatsu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/735,721

(22) Filed: Dec. 16, 2003

(30) Foreign Application Priority Data

May 14, 2003 (JP) ..................... 2003-135450

(51) Int. Cl.[7] .............................. H03M 1/38
(52) U.S. Cl. ..................... 341/161; 341/155
(58) Field of Search ............... 341/161, 155, 341/122

(56) References Cited

U.S. PATENT DOCUMENTS

| | | | |
|---|---|---|---|
| 6,295,016 B1 | 9/2001 | Chiang | 341/161 |
| 6,337,651 B1 | 1/2002 | Chiang | 341/161 |
| 6,486,820 B1 | 11/2002 | Allworth et al. | 341/161 |
| 6,683,554 B2 * | 1/2004 | Nikai et al. | 341/161 |
| 6,700,524 B2 * | 3/2004 | Naka et al. | 341/161 |
| 2004/0046684 A1 * | 3/2004 | Cusinato | 341/161 |

FOREIGN PATENT DOCUMENTS

| | | | |
|---|---|---|---|
| JP | 10-178345 | 6/1998 | H03M/1/38 |
| JP | 2002-314420 | 10/2002 | H03M/1/38 |

* cited by examiner

*Primary Examiner*—Peguy JeanPierre
(74) *Attorney, Agent, or Firm*—Nixon Peabody LLP; Donald R. Studebaker

(57) ABSTRACT

An analog input signal A1 is held by a sample-hold-amplifier (SHA) 12 to be outputted as a voltage V12. The V12 is converted into a digital signal of 1,5 bits by sub-A/D converters (SADC: comparators 13, 14, and an encoder 15), and the digital signal is further converted into an analog signal by sub-D/A converters (SDAC: switches 16a, 16b, 16c) to be delivered to an SHA 18. The SHA 18 amplifies a difference in voltage between the voltage V12 and the SDAC by a factor of two to thereby output a voltage VA, which is delivered to an analog-to-digital conversion stage 20. By so doing, the range of an input voltage of the respective SHAs is suppressed to ½ of that for the conventional case, thereby enabling high-speed operation to be executed without impairing linearity.

3 Claims, 6 Drawing Sheets

US 6,803,873 B1

PIPELINE ANALOG TO DIGITAL CONVERTER

FIELD OF THE INVENTION

The present invention relates to a pipeline analog-to-digital converter comprising a plurality of analog-to-digital converters, each for 1.5 bits (hereinafter referred to as an ADC), connected in series.

BACKGROUND OF THE INVENTION

FIGS. 1 to 3 are block diagrams broadly showing a conventional pipeline ADC, respectively.

As shown in FIG. 1 illustrating a general configuration, this pipeline ADC has a sample-hold-amplifier (hereinafter referred to as an SHA) for sampling and holding an analog input signal A1 in a predetermined cycle on the basis of a timing signal TM. Series-connected analog-to-digital conversion stages each for 1.5 bits (hereinafter referred to as an STG), namely, STGs $2_1$ to $2_m$ are connected to the output side of the SHA 1.

The respective STGs $2_1$ to $2_m$, as shown in FIG. 2 illustrating the configuration thereof, comprise a sub-ADC ((hereinafter referred to as an SADC) 3, a sub-digital-to-analog converter ((hereinafter referred to as an SDAC) 4, a subtracter 5, and an SHA 6 with a voltage amplification factor set at 2. The SADC 3 is for comparing an input voltage. V1 with reference voltages ±VR/4, and detecting which of three voltage ranges, namely, a voltage range below −VR/4, a voltage range of from −VR/4 to +VR/4, and a voltage range above +VR/4, the input voltage V1 falls in. Respective signals A, B, C, of 1.5 bits, indicating the result of such detection, are delivered to the SDAC 4. The SDAC 4 outputs voltages −VR/2, 0, +VR/2 in accordance with the signals A, B, C, respectively. The output side of the SDAC 4 is connected to the negative input terminal of the subtracter 5, and the input voltage V1 is connected to the positive input terminal of the subtracter 5. The subtracter 5 is for subtracting an output voltage of the SDAC 4 from the input voltage V1 to thereby deliver a difference in voltage to the SHA 6. The SHA 6 amplifies the difference in voltage, delivered from the subtracter 5, by a factor of two, and holds an amplified voltage, thereby outputting the amplified voltage as an output voltage VO.

Connected to the output side of the STG $2_m$ in the final stage is an SADC 7 for converting a voltage outputted from the STG $2_m$ into a digital signal of 2 bits. The signals A, B, C, representing the result of the detection by the respective STGs $2_1$ to $2_m$, and the digital signal D outputted from the SADC 7 after conversion are delivered to an encoder 8. Further, the timing signal TM generated by a timing generator 9 is delivered to the SHA 1, the STGs $2_1$ to $2_m$, the SADC 7, and the encoder 8.

The encoder 8 sequentially shifts and holds the signals A, B, C, representing the result of the detection, outputted from the respective STGs $2_1$ to $2_m$, on the basis of the timing signal TM, executing pipeline processing of the respective detection results of the STGs $2_1$ to $2_m$ against the analog input signal A1, correspondingly to the digital signal D outputted from the SADC 7, to thereby generate and output a digital signal DO.

FIG. 3 is an input/output characteristic diagram showing operation of the respective STGs $2_1$ to $2_m$. The operation thereof is described hereinafter with reference to FIG. 3. The analog input signal A1 is sampled on the basis of the timing signal TM, and held by the SHA 1. The signal as held is delivered as the input voltage V1 to the STGs $2_1$ in the initial stage, whereupon the SADC 3 of the STGs $2_1$ compares the input voltage V1 with the reference voltages ±VR/4, to thereby make determination. The result of the determination is outputted by rendering any one of the signals A, B, C to represent "1".

If the input voltage V1 is below −VR/4, the signal A representing the result of the determination by the SADC 3 is turned into "1" while the signals B, C are turned into "0", respectively. If the input voltage V1 is in the range of from −VR/4 to +VR/4, the signal B is turned into "1" while the signals A, C are turned into "0", respectively, and if the input voltage V1 is above +VR/4, the signals A, B are turned into "0", respectively, while the signal C is turned into "1". Those signals A, B, C are delivered to the SDAC 4.

At the SDAC 4, when the signal A is "1", −VR/2 is outputted as the reference voltage, and when the signals B, C are "1", respectively, 0, +VR/2 are outputted as the reference voltages, respectively. The reference voltage outputted from the SDAC 4 is delivered to the subtracter 5 where the reference voltage is subtracted from the input voltage V1. A voltage outputted from the subtracter 5 is held by the SHA 6 on the basis of the timing signal TM and amplified by a factor of two before being delivered as the output voltage VO.

Thus, as shown in FIG. 3, if the input voltage V1 of the STG $2_1$ is in the voltage range below −VR/4, the output voltage VO thereof falls in a voltage range of from −VR to +VR/2. Further, if the input voltage V1 is in the voltage range of from −VR/4 to +VR/4, the output voltage VO thereof falls in a voltage range of from −VR/2 to +VR/2, and if the input voltage V1 is in the voltage range above +VR/4, the output voltage VO falls in a voltage range of from −VR/2 to +VR. The output voltage VO of the STG $2_1$ is delivered as an input voltage V1 to STG $2_2$ in the next stage.

In this way, the respective digital signals of 1.5 bits are outputted from the respective STGs $2_1$ to $2_m$, on the basis of the timing signal TM, and pipeline processing of those digital signals is executed by the encoder 8, thereby generating the digital signal DO of a predetermined bits.

With the conventional pipeline ADC, however, the following problems have been encountered. That is, since the output voltage VO of each of the STGs 2 is delivered as an input voltage V1 to the STG 2 in the next stage, strict linearity is required of the SHA 6 of the respective STGs 2 such that the output voltage is directly proportional to the input voltage. This is because in the case of poor linearity, an accurate digital value cannot be obtained due to nonlinear distortion at the time of amplification.

Meanwhile, the output voltage VO outputted from the respective STGs $2_1$ to $2_m$ ranges from −VR to +VR, and the input voltage to the SHA 6, corresponding thereto, ranges from −VR/2 to +VR/2. Accordingly, accurate linearity against a wide range of the input voltage is required of the respective SHAs 6. Furthermore, a higher conversion speed is required of the respective SHAs 6. However, high accuracy and high speed being factors required of an amplifier, contradictory to each other, it is not possible to maximize both the factors at the same time. For this reason, with the conventional configuration as shown in FIG. 1, it has been impossible to provide the pipeline ADC simultaneously meeting requirements for high accuracy and high speed.

SUMMARY OF THE INVENTION

To solve the problems described as above, in accordance with a first aspect of the invention, there is provided a pipeline ADC for obtaining a digital output signal of a predetermined bits, corresponding to an analog input signal as the target for conversion, by executing pipeline processing based on a clock signal, said pipeline analog-to-digital converter comprising a plurality of STGs connected in series, each comprising an SADC for converting an analog input voltage into a digital signal of 1.5 bits, an SDAC for converting the digital signal into an analog voltage, and an amplifier for sampling and holding a difference in voltage between the input voltage and the analog voltage and amplifying the difference in voltage as held, wherein the STG to which the analog input signal is delivered, in the initial stage of said plurality of the STGs, has the following configuration.

That is, the STG in the initial stage comprises a first amplifier for sampling and holding the analog input signal to thereby output a voltage equivalent to 1/N (provided that N is either 2 or 3) of the analog input signal as a first analog voltage, a first SADC for converting the first analog voltage into a first digital signal of 1.5 bits, a first SDAC for converting the first digital signal into a second analog voltage, a second amplifier for sampling and holding a difference in voltage between the first and second analog voltages, and amplifying the difference in voltage as held by a factor of N to thereby output a third analog voltage.

Said STG further comprises a second SADC for converting the third analog voltage into a second digital signal of 1.5 bits, a second SDAC for converting the second digital signal into a fourth analog voltage, a third amplifier for sampling and holding a difference in voltage between the third and fourth analog voltages, and amplifying the difference in voltage as held by a factor of two to be thereby delivered to the STG in the next stage, and a discriminator for generating a digital signal of 1.5 bits, corresponding to the most significant bit, on the basis of the first and second digital signals.

In the first aspect of the invention, since the pipeline ADC is made up as described above, the STG in the initial stage operates as follows; the analog input signal is sampled and held by the first amplifier, and the voltage equivalent to 1/N of the analog input signal is outputted as the first analog voltage. The first analog voltage is converted into the first digital signal of 1.5 bits by the first SADC, and further, the first digital signal is converted into the second analog voltage by the first SDAC. The first and second analog voltages are delivered to the second amplifier and a difference in voltage therebetween is sampled and held to be further amplified by a factor of N, thereby being outputted as the third analog voltage.

The third analog voltage is converted into the second digital signal of 1.5 bits by the second SADC, and further, the second digital signal is converted into the fourth analog voltage by the second SDAC. The third and fourth analog voltages are delivered to the third amplifier, and a difference in voltage therebetween is sampled and held to be further amplified by a factor of two, thereby being delivered to the STG in the next stage. Meanwhile, the discriminator generates the digital signal of 1.5 bits, corresponding to the most significant bit, on the basis of the first and second digital signals.

Due to such a configuration as described above, the range of the analog voltage delivered to the respective amplifiers is reduced to ½ of that for the conventional case, so that requirements for high accuracy and high speed can be simultaneously met.

The invention provides in its second aspect a pipeline ADC similar to that in its first aspect, comprising a STG in the initial stage, having the following configuration.

More specifically, said STG in the initial stage comprises a first holder for holding and outputting a voltage obtained by adding a reference voltage to an analog input signal, a second holder for holding and outputting the analog input signal, a third holder for holding and outputting a voltage obtained by subtracting the reference voltage from the analog input signal, a first sub-A/D converter for comparing the analog input signal with a voltage equivalent to ±½ of the reference voltage to thereby convert the analog input signal into a first digital signal of 1.5 bits, selectors for selecting a voltage outputted from any one of the first, the second, and the third holder, in accordance with the first digital signal, to thereby output as a first analog voltage.

The STG in the initial stage further comprises a second sub-A/D converter for converting the first analog voltage into a second digital signal of 1.5 bits, a sub-D/A converter for converting the second digital signal into a second analog voltage, an amplifier for sampling and holding a difference in voltage between the first and second analog voltages, and amplifying the difference in voltage as held by a factor of two so as to be delivered to the STG in the next stage, and a discriminator for generating a digital signal of 1.5 bits, corresponding to the most significant bit, on the basis of the first and second digital signals.

PREFERRED EMBODIMENTS OF THE INVENTION

First Embodiment

Figure 1:
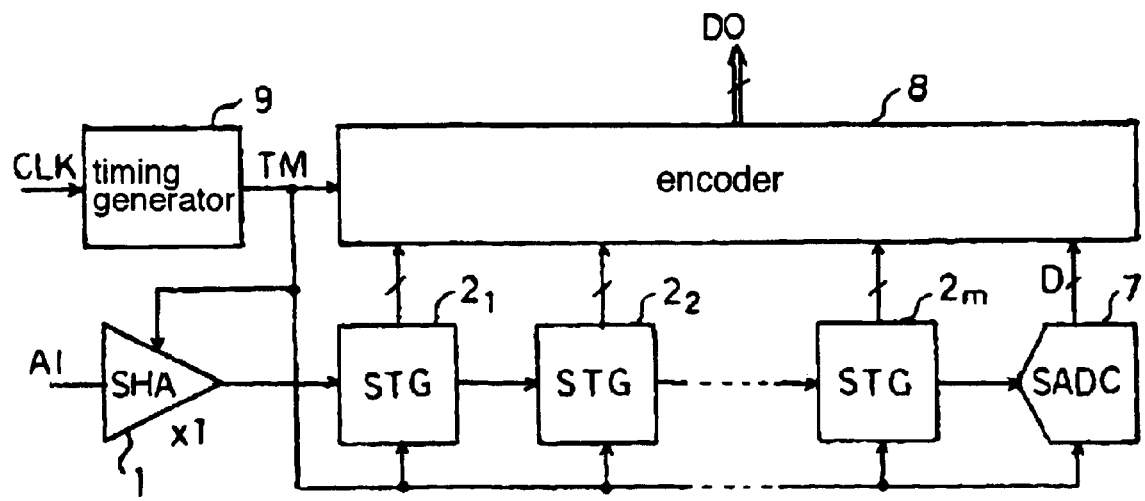
FIGS. 1 to 3 are block diagrams broadly showing a conventional pipeline ADC, respectively.
Figure 2:
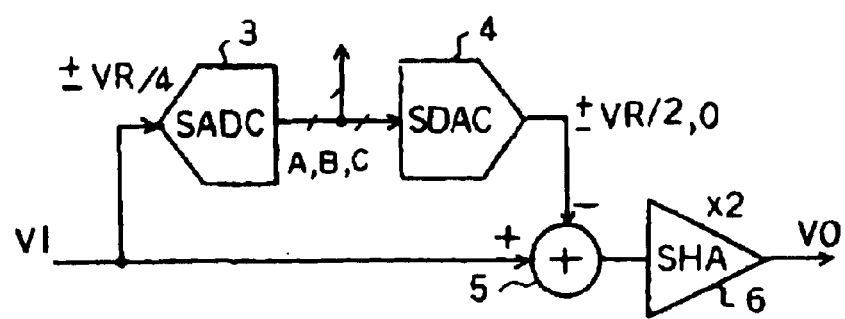
Figure 3:
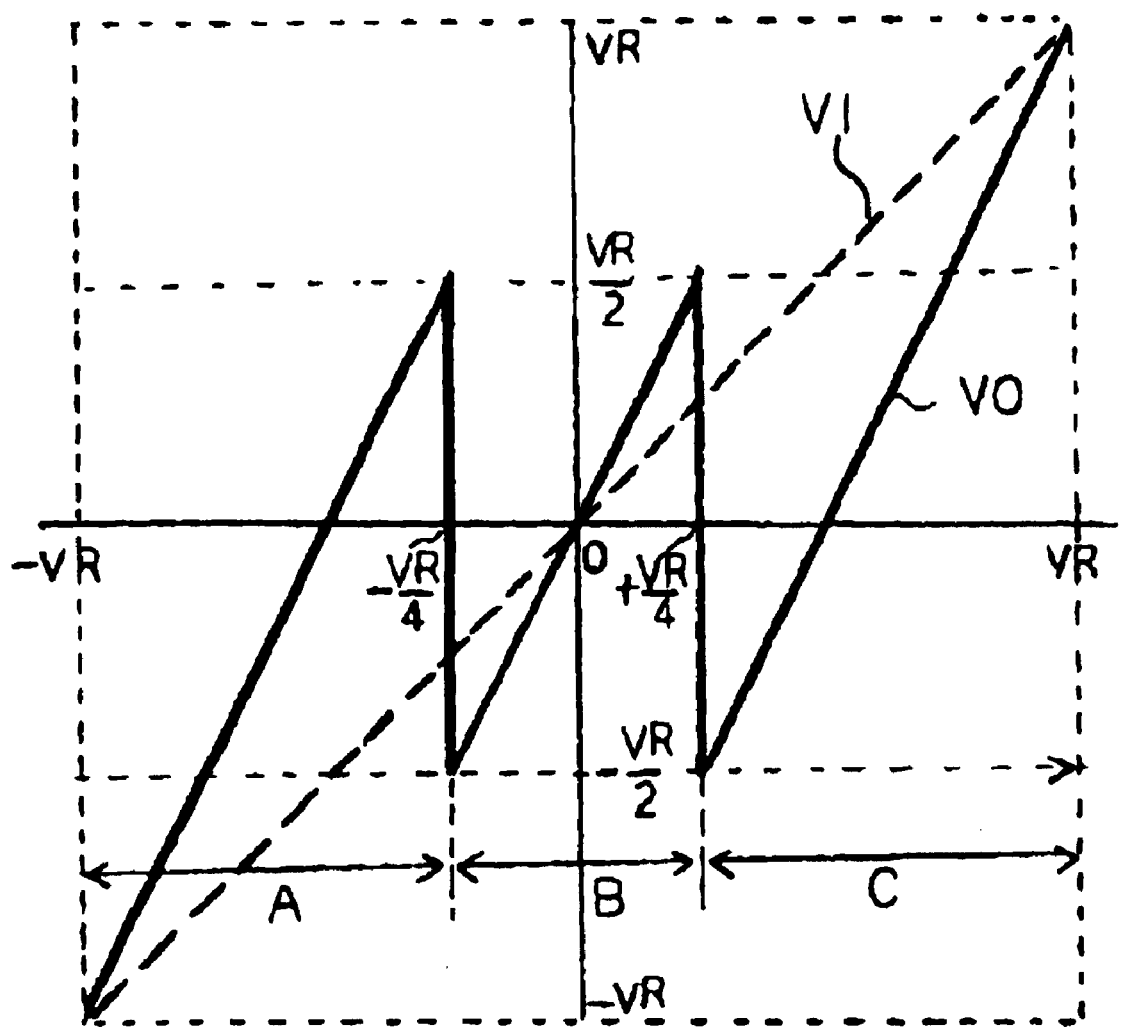
Figure 4:
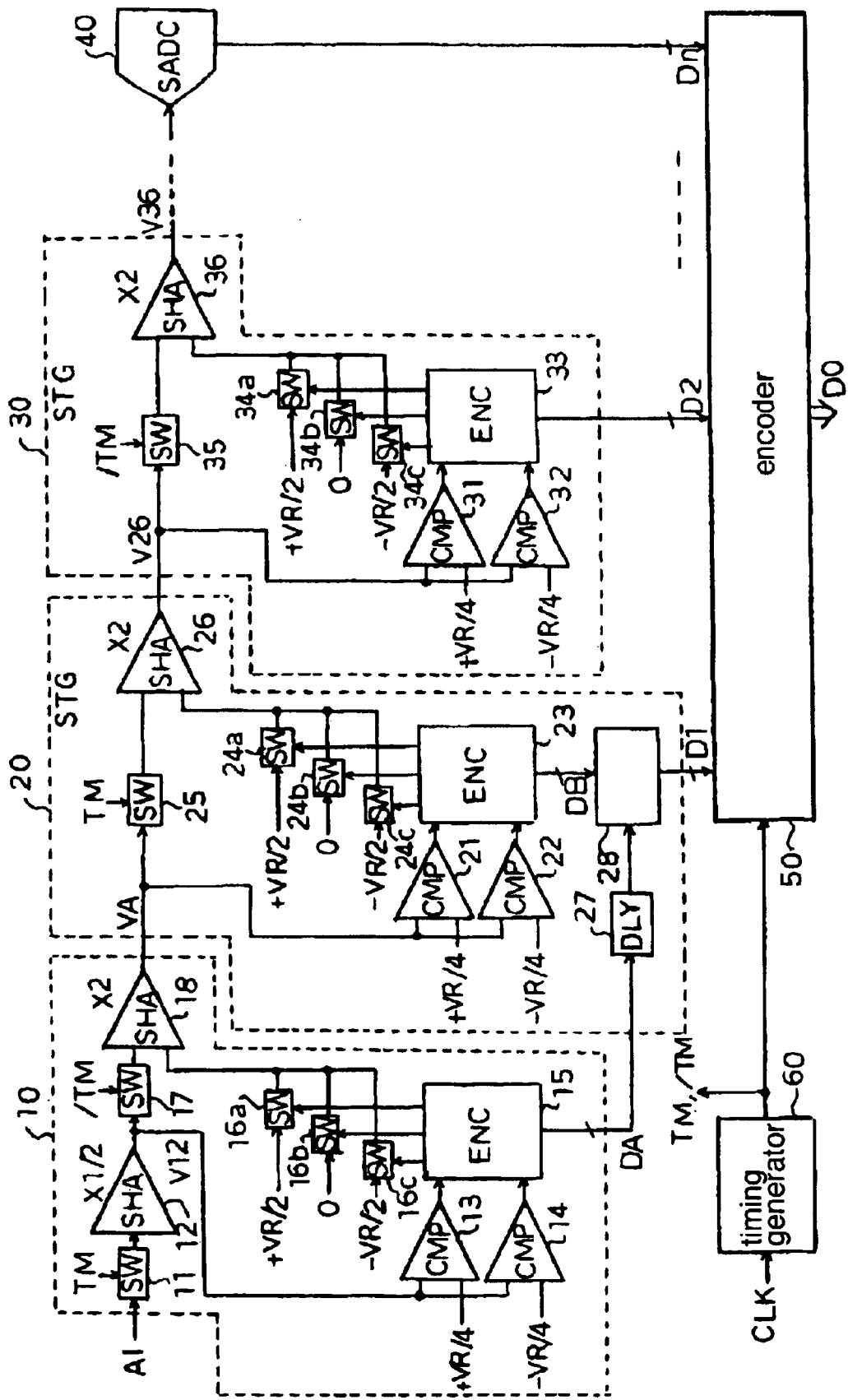
FIG. 4 is a block diagram broadly showing a first embodiment of a pipeline ADC according to the invention.

FIG. 4 is a block diagram broadly showing a first embodiment of a pipeline ADC according to the invention.

The pipeline ADC has an input processor 10 for processing an analog input signal A1 as a target for conversion by sampling the same in a predetermined cycle on the basis of complementary timing signals TM, /TM, and a STG 20 in a first stage for converting an output signal from the input processor 10 into a digital signal. Further, the pipeline ADC has a plurality of STGs 30 in second and subsequent stages (one in the second stage only is shown in FIG. 4), a SADC40 in the final stage, an encoder 50 for generating a digital signal DO of a predetermined number of bits on the basis of an output signal of the STG 20, STGs 30, and SADC40, respectively, and a timing generator 60.

The input processor 10 has a switch (SW) 11 to which the analog input signal A1 is delivered and is cyclically turned ON/OFF by the timing signal TM, and a SHA12 with a voltage amplification factor of ½ is connected to the output side of the switch 11. The SHA 12 is for sampling and holding an input voltage, thereby outputting a voltage V12 as held. The output side of the SHA12 is connected to a SADC where the voltage V12 is converted into a digital signal DA of 1.5 bits. The SADC comprises comparators (CMP) 13, 14, and an encoder (ENC) 15, and the output side of the SHA 12 is connected to the input side of the comparators 13, 14, respectively.

The comparators 13, 14 compares the voltage V12 delivered from the SHA 12 with respective reference voltages +VR/4, −VR/4, and the respective output sides of the comparators 13, 14 are connected to the encoder 15. The encoder 15 is capable of detecting which of three voltage ranges, namely, a voltage range below −VR/4, a voltage range of from −VR/4 to +VR/4, and a voltage range above +VR/4, the voltage V12 falls in.

The detection result of the encoder 15 is delivered to the STG 20 as the digital signal DA, and is also delivered as an input signal to a SDAC for 1.5 bits, in other words, as a control signal for switches 16a, 16b, 16c, respectively, making up the SDAC. More specifically, if the voltage V12 is below −VR/4, the switch 16a is turned ON, thereby selecting a reference voltage +VR/2, if the voltage V12 is in the range of from −VR/4 to +VR/4, the switch 16b is turned ON, thereby selecting a common voltage VC (=0), and if the voltage V12 is above +VR/4, the switch 16c is turned ON, thereby selecting a reference voltage −VR/2.

Further, the voltage V12 is delivered to a first input terminal of a SHA 18 via a switch 17 which is turned ON/OFF by the timing signal /TM. The output side of the switches 16a, 16b, 16c, respectively, is connected to a second input terminal of the SHA 18. The SHA 18 samples and holds the result of addition of voltages delivered to the first and second input terminals thereof, respectively, thereby outputting a voltage VA obtained by amplifying such a voltage as held by a factor of two. That is, the SHA 18 has a function of amplifying a difference in voltage between the voltage V12 and a voltage obtained by digital conversion of the voltage V12 into 1.5 bits, followed by further conversion thereof into analog, by a factor of two.

Meanwhile, the STG 20 is connected to a SADC for converting the voltage VA delivered from the input processor 10 into a digital signal DB of 1.5 bits. The SADC comprises comparators 21, 22, and an encoder 23, the voltage VA being delivered to the comparators 21, 22, respectively. The comparators 21, 22 compares the voltage VA with respective reference voltages +VR/4, −VR/4, and the respective output sides of the comparators 21, 22 are connected to the encoder 23. The encoder 23 is capable of detecting which of the three voltage ranges, namely, a voltage range below −VR/4, a voltage range of from −VR/4 to +VR/4, and a voltage range above +VR/4, the voltage VA falls in.

The detection result of the encoder 23 is outputted as a digital signal DB and is also delivered as a control signal for switches 24a, 24b, 24c, respectively, making up a SDAC for 1.5 bits. More specifically, if the voltage VA is below −VR/4, the switch 24a is turned ON, thereby selecting the reference voltage +VR/2, if the voltage VA is in the range of from −VR/4 to +VR/4, the switch 24b is turned ON, thereby selecting the common voltage VC (=0), and if the voltage VA is above +VR/4, the switch 24c is turned ON, thereby selecting the reference voltage −VR/2.

Further, the voltage VA is delivered to a first input terminal of a SHA 26 via a switch 25 which is turned ON/OFF by the timing signal TM. The output side of the switches 24a, 24b, 24c, respectively, is connected to a second input terminal of the SHA 26. As with the SHA 18, the SHA 26 samples and holds the result of addition of voltages delivered to the first and second input terminal thereof, respectively, thereby outputting a voltage obtained by amplifying such a voltage as held by a factor of two. That is, the SHA 26 has a function of amplifying a difference in voltage between the voltage VA and a voltage obtained by digital conversion of the voltage VA into 1.5 bits, followed by further conversion thereof into analog, by a factor of two.

The digital signal DA outputted from the encoder 15 is delivered to a discriminator 28 via a delay circuit (DLY) 27 having delay time of a half cycle while the digital signal DB outputted from the encoder 23 is delivered as it is to the discriminator 28. The discriminator 28 determines a digital signal D1 of 1.5 bits, corresponding to the most significant bit (referred to as MSB hereinafter) on the basis of the digital signals DA, DB, thereby delivering the digital signal D1 to an encoder 50.

The plurality of STGs 30 in the second and subsequent stages are connected in series to the output side of the STG 20. The STGs 30 in the respective stages are identical in configuration, and are substantially same in configuration as the STG 20 in the first stage. More specifically, STGs 30 are equivalent to the STG 20 without the delay circuit 27 and the discriminator 28.

For example, the STG 30 in the second stage has a SADC for converting a voltage V26 delivered from the STG 20 into a digital signal D2 of 1.5 bits, comprising comparators 31, 32, and an encoder 33. Further, a SDAC for 1,5 bits, made up of switches 34a, 34b, 34c, is connected to the output side of the SADC. The output side of the SDAC is connected to a second input terminal of a SHA 36, and a voltage V26 is delivered to a first input terminal of the SHA 36 via a switch 35 which is turned ON/OFF by the timing signal/TM. The SHA 36 is same in configuration as the SHA 26 and a voltage V36 is outputted from the output side of the SHA 36 to be thereby delivered to a STG in the next stage.

Further, an output signal from the STG in the final stage is delivered to the SADC 40 for 2 bits, and the SADC 40 converts the output signal into a digital signal Dn of 2 bits, containing the least significant bit (referred to as LSB hereinafter), to be thereby delivered to an encoder 50. The encoder 50 sequentially shifts and holds the digital signals D1, D2, . . . , representing the respective detection results outputted from the STG 20, and STGs 30 in the respective stages, on the basis of the timing signals TM, /TM, executing pipeline processing of the respective detection results of the STG 20, and STGs 30 in the respective stages against the analog input signal A1, correspondingly to the digital signal Dn outputted from the SADC 40, to thereby generate and output a digital signal DO.

Figure 5:
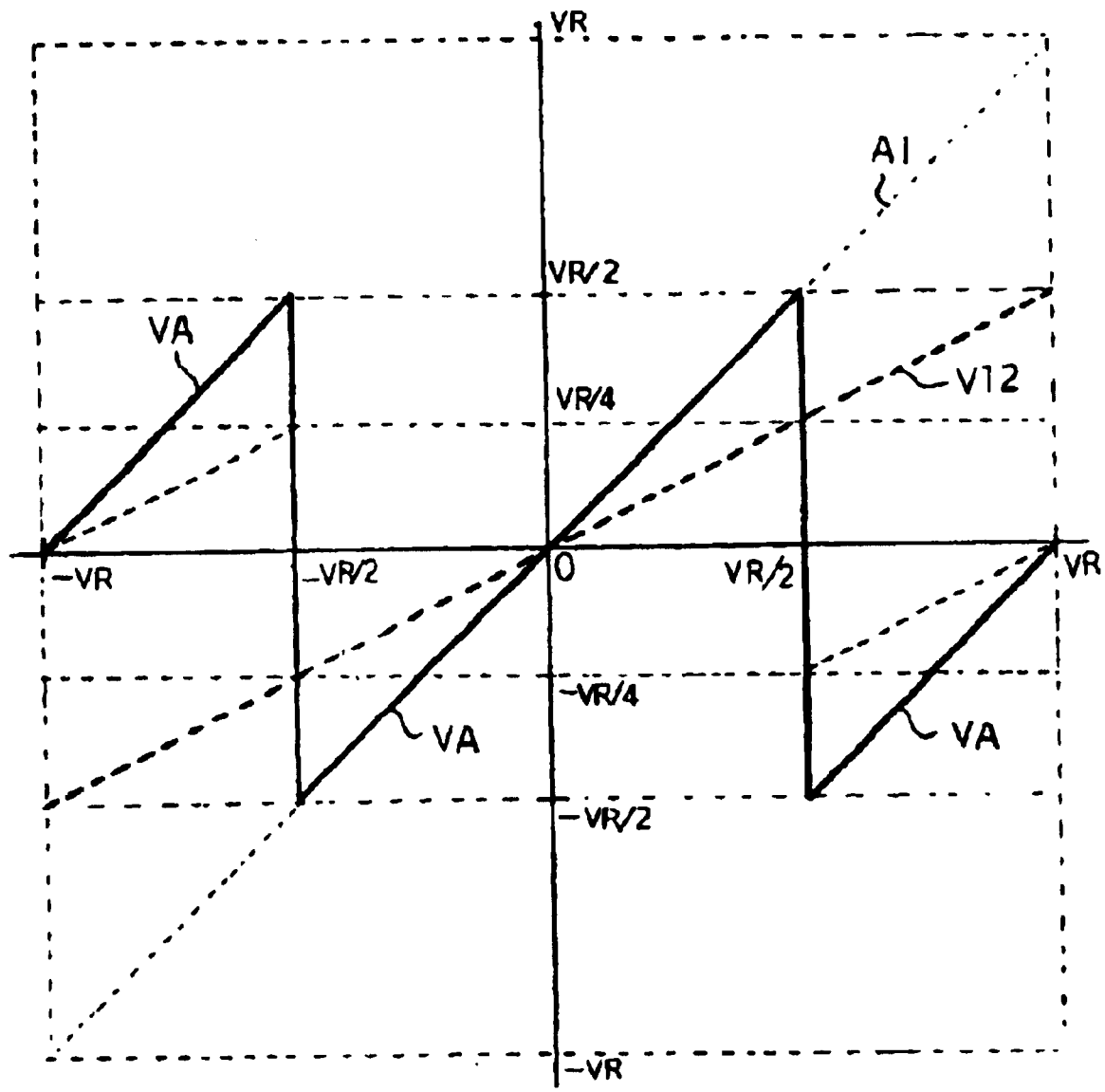
FIG. 5 is an input/output characteristic diagram showing operation of an input processor 10 shown in FIG. 4.

FIG. 5 is an input/output characteristic diagram showing operation of the input processor 10 shown in FIG. 4. The operation of the input processor 10 in FIG. 4 is described hereinafter with reference to FIG. 5.

The analog input signal A1 is delivered to the SHA 12 via the switch 11 on the basis of the timing signal TM, and is amplified to ½ as shown by a chain line in FIG. 5 to be thereby delivered as the voltage 12 to the comparators 13, 14, respectively. As a result, the analog input signal A1 having a voltage range of −VR to +VR is compressed to the voltage 12 in a voltage range of −VR/2 to +VR/2.

After a lapse of a half cycle, the switch 11 is opened while the switch 17 is closed by the timing signal /TM, whereupon the voltage 12 outputted from the SHA 12 is sampled and held at that timing, and the voltage 12 as held is delivered to the first input terminal of the SHA 18 via the switch 17. Further, comparison results of the comparators 13, 14, respectively, are delivered to the encoder 15 and the encoder 15 detects which of the three voltage ranges, namely, the voltage range below −VR/4, the voltage range of from −VR/4 to +VR/4, and the voltage range above +VR/4, the voltage V12 falls in.

The detection result of the encoder 15 is delivered as the digital signal DA to the delay circuit 27, and based on the detection result, any of the switches 16a, 16b, 16c is turned ON. More specifically, if the voltage V12 is below −VR/4, the switch 16a is turned On, thereby selecting the reference voltage +VR/2, if the voltage V12 is in the range of from −VR/4 to +VR/4, the switch 16b is turned ON, thereby selecting the common voltage VC, and if the voltage V12 is above +VR/4, the switch 16c is turned ON, thereby selecting the reference voltage −VR/2. The respective selected voltages are delivered to the second input terminal of the SHA 18.

At the SHA 18, those voltages delivered to the two input terminals thereof, respectively, are added up, and the result of addition thereof is amplified by a factor of two to be thereby outputted as the voltage VA. Accordingly, as indicated by a heavy line in FIG. 5, the voltage VA is in a range of from 0 to +VR/2 when the voltage V12 is in a range of from −VR/2 to −VR/4, in a range of −VR/2 to +VR/2 when the voltage V12 is in a range of from −VR/4 to +VR/4, and in a range of from −VR/2 to 0 when the voltage V12 is in a range of from +VR/4 to +VR/2. That is, the range of the voltage VA outputted from the SHA 18 is compressed to a range of −VR/2 to +VR/2.

After a lapse of another half cycle, the switch 11 is turned ON, and the analog input signal A1 is newly delivered to the SHA 12. Meanwhile, upon the switch 17 being turned OFF, the voltage VA outputted from the SHA 18 is sampled and held at that timing. The voltage VA as held is delivered to the first input terminal of the SHA 26 via the switch 25 of the STG 20, which is turned in the ON condition. Further, the voltage VA is compared with the reference voltages +VR/4, −VR/4, by the comparators 21, 22, respectively.

The comparison results of the comparators 21, 22, respectively, are delivered to the encoder 23 and the encoder 23 detects which of the three voltage ranges, namely, the voltage range below −VR/4, the voltage range of from −VR/4 to +VR/4, and the voltage range above +VR/4, the voltage VA falls in. The detection result of the encoder 23 is delivered as the digital signal DB to the discriminator 28 while any of the switches 24a, 24b, 24c is turned ON based the detection result. More specifically, if the voltage VA is below −VR/4, the switch 24a is turned ON, thereby selecting the reference voltage +VR/2, if the voltage VA is in the range of from −VR/4 to +VR/4, the switch 24b is turned ON, thereby selecting the common voltage VC, and if the voltage VA is above +VR/4, the switch 24c is turned ON, thereby selecting the reference voltage −VR/2. The respective selected voltages are delivered to the second input terminal of the SHA 26.

At the SHA 26, the voltages delivered to the two input terminals thereof, respectively, are added up, and the result of addition thereof is amplified by a factor of two to be thereby outputted as the voltage V26. Accordingly, the voltage V26 is in the range of from 0 to +VR/2 when the voltage VA is in the range of from −VR/2 to −VR/4, in the range of −VR/2 to +VR/2 when the voltage VA is in the range of from −VR/4 to +VR/4, and in the range of −VR/2 to 0 when the voltage VA is in the range of from +VR/4 to +VR/2. That is, the range of the voltage V26 outputted from the SHA 26 is compressed to a range of from −VR/2 to +VR/2.

Meanwhile, based on the digital signal DA outputted from the encoder 15 and delayed by the delay circuit 27, and the digital signal DB of the encoder 23, the discriminator 28 executes determination processing of the MSB as follows.

If the voltage V12 is detected as below −VR/4 based on the digital signal DA, it is determined that MSB="0", and if the voltage V12 is detected as above +VR/4, it is determined that MSB="1". In the case where the voltage V12 is detected as falling in the range of −VR/4 to +VR/4, the detection result of the voltage VA based on the digital signal DB is further referred to.

Further, the voltage VA is detected as below −VR/4 based on the digital signal DB, it is determined that MSB="0", and if the voltage VA is detected as above +VR/4, it is determined that MSB="1". In the case where the voltage VA is detected as falling in the range of from −VR/4 to +VR/4, the determination is held for the time being to be referred to the detection results of the STG 30 in the next stage and those in subsequent stages, respectively. The result of the determination processing by the discriminator 28 is delivered as the digital signal D1 to the encoder 50.

The voltage V26 outputted from the STG 20 is delivered to the STG 30 in the next stage. In the STG 30, the same operation as that of the comparator 21 through the SHA 26, inside the STG 20, is executed against the voltage V26 as delivered. While description of the operation in the STG 30 is omitted herein, the digital signal D2 is sent out from the encoder 33 to the encoder 50, and the voltage V36 is sent out from the SHA 36 to the STG in the subsequent stage. An output voltage of the final stage of the STGs 30 connected in series is delivered to the SADC 40 where the output voltage is converted into the digital signal Dn of 2 bits, containing the LSB.

The encoder 50 sequentially shifts and holds the digital signals D1, D2, . . . , representing the respective detection results outputted from the STG 20, and the STGs 30 in the respective stages, on the basis of the timing signals TM, /TM. Then, there is made comprehensive determination on the respective detection results of the STG 20, and the STGs 30 against the analog input signal A1, correspondingly to the digital signal Dn outputted from the SADC 40, and the digital signal DO of a predetermined n bits is generated to be thereby being sent out.

As described in the foregoing, the first embodiment of the pipeline ADC according to the invention has the input processor 10 wherein the voltage range of the analog input signal A1 is compressed to ½ to thereby detect a range of the input voltage, and based on the result of such detection, a level of the input voltage is shifted to amplify again the input voltage by a factor of two. Accordingly, it becomes possible to limit the range of the input voltage as well as the output voltage of the respective SHAs to ½ of that for the conventional case. Consequently, the invention has advantageous effects in that linearity can be improved without causing deterioration in operation speed, and the pipeline ADC excellent in speed and accuracy can be provided.

Second Embodiment

Figure 6:
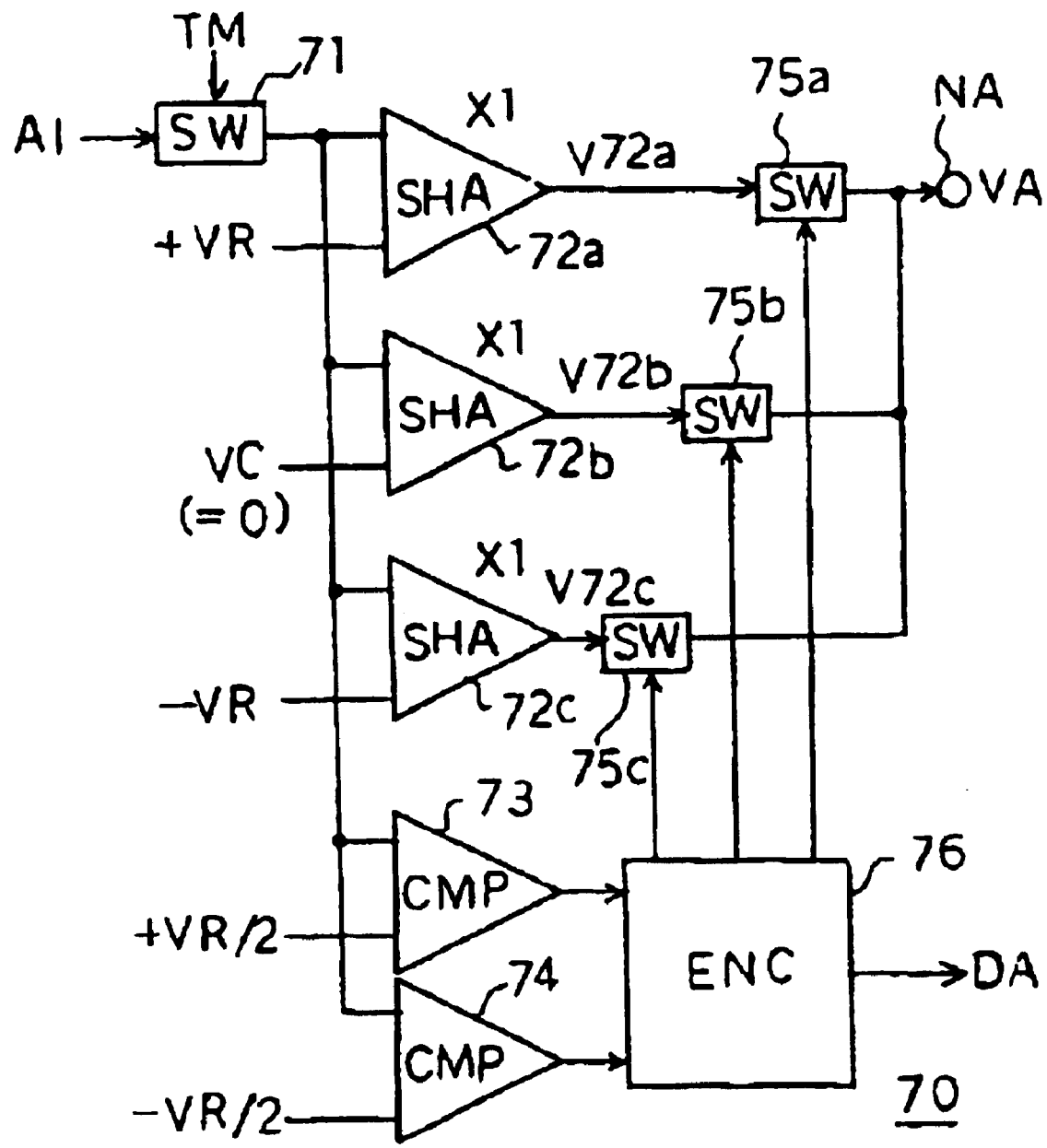
FIGS. 6 and 7 are schematic representations of an input processor 70 of a second embodiment of a pipeline ADC according to the invention.
Figure 7:
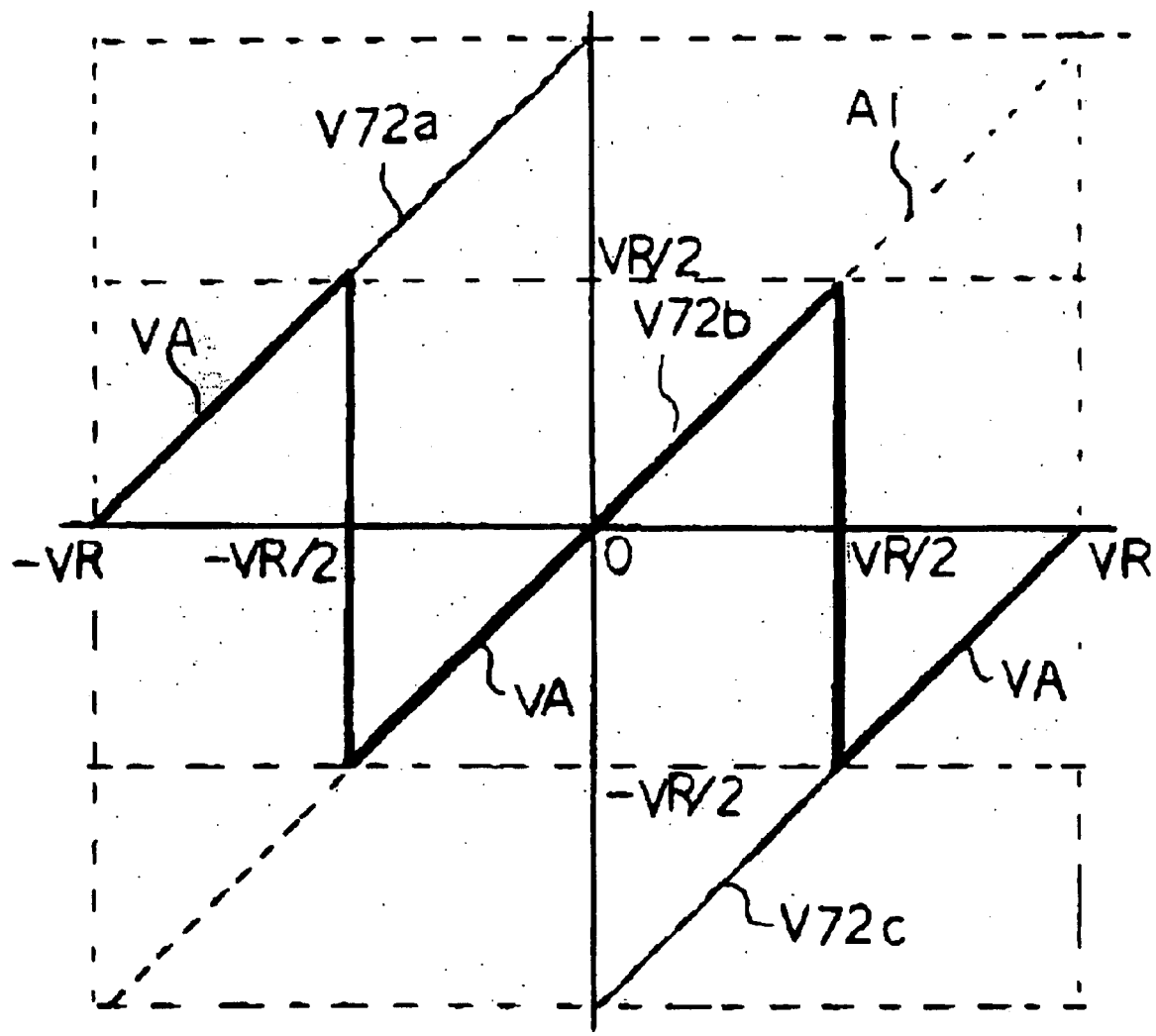

FIGS. 6 and 7 are schematic representations of an input processor 70 of a second embodiment of a pipeline ADC according to the invention. FIG. 6 is block diagram thereof, and FIG. 7 is an input/output characteristic diagram showing operation of the input processor 70 shown in FIG. 6.

The input processor 70 is provided in place of the input processor 10 in FIG. 4, and has a switch 71 which is turned ON/OFF by the timing signal TM. An analog input signal A1 is equally delivered to a first input terminal of SHAs 72a, 72b, 72c, respectively, and comparators 73, 74 via the switch 71. A reference voltage +VR, a common voltage VC (=0), and a reference voltage −VR are delivered to a second input terminal of the SHAs 72a, 72b, 72c, respectively. The SHAs 72a, 72b, 72c add up voltages delivered to the first and second input terminals thereof, respectively, and hold respective voltage representing the result of addition before outputting the same. The respective output sides of the SHAs 72a, 72b, 72c are commonly connected to a node NA via switches 75a, 75b, 75c, respectively.

The comparators 73, 74 compare the analog input signal A1 with reference voltages +VR/2, −VR/2, respectively, to thereby output signals representing comparison results, respectively, to an encoder 76. Based on the respective comparison results of the comparators 73, 74, the encoder 76 detects which of three voltage ranges, namely, a voltage range below −VR/2, a voltage range of from −VR/2 to +VR/2, and a voltage range above +VR/2, the analog input signal A1 falls in. More specifically, the comparators 73, 74, and the encoder 76 make up an SADC for 1.5 bits, and the detection result of the encoder 76 is outputted as a digital signal DA, and is also delivered as a control signal to the switches 75a, 75b, 75c, respectively.

In consequence, control can be implemented such that if the analog input signal A1 is below −VR/2, the switch 75a is turned ON, if the analog input signal A1 is in the range of from −VR/2 to +VR/2, the switch 75b is turned ON, and if the analog input signal A1 is above +VR/2, the switch 75c is turned ON. Then, a voltage selected by any one of the switches 75a, 75b, 75c is delivered as a voltage VA to the node NA.

Now, operation is described hereinafter. When the switch 71 is turned ON, the analog input signal A1 is delivered to the first input terminal of the SHAs 72a, 72b, 72c, respectively. Accordingly, as shown in FIG. 7, a voltage V72a outputted from the SHA 72a is equal to A1+VR. Further, a voltage V72b outputted from the SHA 72b is equal to A1, and a voltage V72c outputted from the SHA 72c is equal to A1 −VR.

Meanwhile, when the analog input signal A1 is below −VR/2, the encoder 76 outputs the control signal to cause the switch 75a to be turned ON. Accordingly, when the analog input signal A1 is below −VR/2, the voltage VA delivered to the node NA is represented by a heavy line portion of the voltage V72a, in FIG. 7. Further, when the analog input signal A1 is in the range of from −VR/2 to +VR/2, the switch 75b is turned ON, the voltage VA delivered to the node NA is represented by a heavy line portion of the voltage V72b, in FIG. 7. Still further, when the analog input signal A1 is above +VR/2, the switch 75c is turned ON, and the voltage VA delivered to the node NA is represented by a heavy line portion of the voltage V72c, in FIG. 7.

Accordingly, the voltage VA outputted from the node NA of the input processor 70 is in a range of from −VR/2 to +VR/2 as with the voltage VA shown in FIG. 5 of the input processor 10 in FIG. 4.

As described in the foregoing, the input processor 70 according to the second embodiment of the invention is configured such that shift is made only to the extent of the absolute value of the reference voltage, VR, against a voltage range where the absolute value of the analog input signal A1 is in excess of VR/2, thereby causing the voltage VA to fall in the range of from −VR/2 to +VR/2. As a result, it becomes possible to limit the range of the input voltage as well as the output voltage of the respective SHAs in subsequent stages to ½ of that for the conventional case, so that the second embodiment of the invention, although simpler in configuration, can have the same advantageous effects as those for the first embodiment.

It is to be pointed out that the scope of the invention is not limited to the above-described embodiments, and various variations thereto are possible. Such variations include, for example, the followings:
(a) With the respective SHAs 18, 26, . . . , the voltages delivered to the first and second input terminals thereof, respectively, are added up, however, the configuration thereof may be altered such that the polarity of the voltage delivered to, for example, the second input terminal is reversed to thereby execute subtraction. That is, the respective SHAs 18, 26, 36 may be configured such that a difference in voltage between the analog voltage delivered from a preceding stage and the analog voltage outputted from the SDAC for 1.5 bits is amplified and outputted.
(b) The SADC 40 for 2 bits is provided in the final stage, however, an SADC for 1 bit may be alternatively used by installing the STG 30 in one more stage.
(c) The respective STGs adopt a 1.5 bits scheme wherein the two comparison voltages are classified into the three voltage ranges, however, there may be alternatively adopted a 2.5 bits scheme wherein four comparison voltages are classified into five voltage ranges each for X¼.
(d) With the input processor 10 in FIG. 4, the gain of the SHA 12 is set at X½, and the gain of the SHA 18 is set at X2. However, the gain of the SHA 12 may be set at X¼, and the gain of the SHA 18 may be set at X4.

As described in detail hereinbefore, the first embodiment of the invention has the STG in the initial stage, comprising a first amplifier for holding an analog input signal to thereby output a voltage equivalent to 1/N of the analog input signal. As a result, an input voltage range of the amplifier of the respective STGs is reduced to X1/N, so that an output voltage excellent in linearity can be obtained by the amplifier, thereby enabling the pipeline ADC simultaneously meeting requirements for high accuracy and high speed to be provided.

Further, with the second embodiment of the invention, the STG in the initial stage comprises first to third holders for increasing or decreasing an analog input signal by the respective reference voltages thereof before outputting, a first SADC for comparing the analog input signal with reference voltage at ±VR/2, respectively, to thereby convert the analog input signal into a first digital signal of 1.5 bits, and selectors for selecting either the analog input signal or the output voltage of any of the first to third holders on the basis of the first digital signal. Consequently, it becomes possible to cause the range of a first analog voltage outputted from the selectors to be within ±VR/2 of the reference voltages, so that the same advantageous effects as those for the first embodiment can be obtained

What is claimed is:
1. A pipeline analog-to-digital converter for obtaining a digital output signal of a predetermined bits, corresponding to an analog input signal as the target for conversion, by executing pipeline processing based on a clock signal, said pipeline analog-to-digital converter comprising a plurality of analog-to-digital conversion stages connected in series, each comprising:
 a sub-A/D converter for converting an analog input voltage into a digital signal of 1.5 bits;
 a sub-D/A converter for converting the digital signal into an analog voltage; and
 an amplifier for sampling and holding a difference in voltage between the input voltage and the analog voltage and amplifying the difference in voltage as held, wherein the analog-to-digital conversion stage to which the analog input signal is delivered, in the initial stage of said plurality of the analog-to-digital conversion stages, comprises a first amplifier for sampling and holding the analog input signal to thereby output a voltage equivalent to 1/N of the analog input signal as a first analog voltage, a first sub-A/D converter for converting the first analog voltage into a first digital signal of 1.5 bits, a first sub-D/A converter for converting the first digital signal into a second analog voltage, a second amplifier for sampling and holding a difference in voltage between the first and second analog voltages, and amplifying the difference in voltage as held by a factor of N to thereby output a third analog voltage, a second sub-A/D converter for converting the third analog voltage into a second digital signal of 1.5 bits, a second sub-D/A converter for converting the second digital signal into a fourth analog voltage, a third amplifier for sampling and holding a difference in voltage between the third and fourth analog voltages, and amplifying the difference in voltage as held by a factor of two to be thereby delivered to the analog-to-digital conversion stage in the next stage, and a discriminator for generating a digital signal of 1.5 bits, corresponding to the most significant bit, on the basis of the first and second digital signals.

2. A pipeline analog-to-digital converter according to claim 1, wherein N is a value selected from numerical values consisting of two and four.

3. A pipeline analog-to-digital converter for obtaining a digital output signal of a predetermined bits, corresponding to an analog input signal as the target for conversion, by executing pipeline processing based on a clock signal, said pipeline analog-to-digital converter comprising a plurality of analog-to-digital conversion stages connected in series, each comprising:

a sub-A/D converter for converting an analog input voltage into a digital signal of 1.5 bits;

a sub-D/A converter for converting the digital signal into an analog voltage; and an amplifier for sampling and holding a difference in voltage between the input voltage and the analog voltage and amplifying the difference in voltage as held, wherein the analog-to-digital conversion stage to which the analog input signal is delivered, in the initial stage of said plurality of the analog-to-digital conversion stages, comprises a first holder for holding and outputting a voltage obtained by adding a reference voltage to the analog input signal, a second holder for holding and outputting the analog input signal, a third holder for holding and outputting a voltage obtained by subtracting the reference voltage from the analog input signal, a first sub-A/D converter for comparing the analog input signal with a voltage equivalent to ±½ of the reference voltage to thereby convert the analog input signal into a first digital signal of 1.5 bits, selectors for selecting a voltage outputted from any one of the first, the second, and the third holder, in accordance with the first digital signal, to thereby output as a first analog voltage, a second sub-A/D converter for converting the first analog voltage into a second digital signal of 1.5 bits, a sub-D/A converter for converting the second digital signal into a second analog voltage, an amplifier for sampling and holding a difference in voltage between the first and second analog voltages, and amplifying the difference in voltage as held by a factor of two so as to be delivered to the analog-to-digital conversion stage in the next stage, and a discriminator for generating a digital signal of 1.5 bits, corresponding to the most significant bit, on the basis of the first and second digital signals.

\* \* \* \* \*